United States Patent
Homoth et al.

(10) Patent No.: US 11,269,005 B2
(45) Date of Patent: Mar. 8, 2022

(54) DEVICE FOR MEASURING A THERMAL DEGRADATION OF THE COOLING PATH OF POWER ELECTRONIC COMPONENTS USING LUMINESCENCE

(71) Applicant: Robert Bosch GmbH, Stuttgart (DE)

(72) Inventors: Jan Homoth, Reutlingen (DE); Jonathan Winkler, Sonnenbuehl (DE)

(73) Assignee: Robert Bosch GmbH, Stuttgart (DE)

( * ) Notice: Subject to any disclaimer, the term of this patent is extended or adjusted under 35 U.S.C. 154(b) by 98 days.

(21) Appl. No.: 16/626,608

(22) PCT Filed: May 17, 2018

(86) PCT No.: PCT/EP2018/062954
§ 371 (c)(1),
(2) Date: Dec. 26, 2019

(87) PCT Pub. No.: WO2019/001842
PCT Pub. Date: Jan. 3, 2019

(65) Prior Publication Data
US 2020/0158777 A1 May 21, 2020

(30) Foreign Application Priority Data

Jun. 28, 2017 (DE) .......... 102017210870.3

(51) Int. Cl.
*G01R 31/28* (2006.01)
*G01K 7/01* (2006.01)
*G01R 31/265* (2006.01)

(52) U.S. Cl.
CPC .......... *G01R 31/2877* (2013.01); *G01K 7/01* (2013.01); *G01R 31/2656* (2013.01); *G01R 31/2856* (2013.01)

(58) Field of Classification Search
CPC ......... H01L 27/14612; H01L 27/14806; H01L 27/14643; H01L 27/14689; H01L 31/0216;
(Continued)

(56) References Cited

U.S. PATENT DOCUMENTS 4,684,812 A * 8/1987 Tew .............. H01L 21/465
250/370.08
6,858,912 B2 * 2/2005 Marshall ........... H01L 27/14609
257/186
(Continued)

FOREIGN PATENT DOCUMENTS

CN 103852706 A 6/2014
CN 104269823 A 1/2015
(Continued)

OTHER PUBLICATIONS

International Search Report for PCT/EP2018/062954, dated Aug. 10, 2018.

*Primary Examiner* — Vinh P Nguyen
(74) *Attorney, Agent, or Firm* — Norton Rose Fulbright US LLP; Gerard Messina

(57) ABSTRACT

A device for converting electrical energy, including at least one switching-type semiconductor component, a cooling path for cooling the semiconductor component, and a device for determining a degradation of the cooling path based on a current having a predetermined current intensity that flows through the component. The device provides that the semiconductor component includes an optically active semiconductor material, which generates light having a brightness that is dependent on a temperature of the semiconductor component when the semiconductor component is traversed by current having a predetermined current intensity, and the device for determining the degradation includes a brightness sensor for recording the brightness of the generated light. The device has the advantage that the device for determining
(Continued)

the degradation and the component are inherently galvanically isolated, and the degradation can be determined at a high resolution.

9 Claims, 2 Drawing Sheets

(58) Field of Classification Search
CPC ..... H01L 27/14601; H01L 2924/12044; H01L 29/732; H01L 31/02327; H01L 31/1105; B23K 15/0013; B23K 26/032; B23K 15/02; B23K 15/08; B23K 15/085; B23K 2103/42; B23K 2103/52; B23K 26/03; B23K 26/20; B23K 26/348; B23K 26/361; B23K 26/362; B23K 26/382; B23K 9/0956; B23K 31/125; G01J 3/0218; G01J 3/10; G01J 3/443; G01J 1/4228; G01J 1/58; G01J 3/2803; G01J 9/0246; G01R 31/2874; G01R 31/2879; G01R 31/26; G01R 31/2601; G01R 31/28; G01R 31/308; G01R 33/032; G06F 3/0412; G06F 3/042; G06F 3/0421; G01K 11/32

See application file for complete search history.

(56) References Cited

U.S. PATENT DOCUMENTS

| | | | | |
|---|---|---|---|---|
| 7,422,988 | B2* | 9/2008 | Adams | B23K 26/0604 |
| | | | | 219/121.62 |
| 7,880,126 | B2* | 2/2011 | Yonemaru | G01J 1/46 |
| | | | | 250/208.1 |
| 9,568,560 | B2* | 2/2017 | Pasqualetto | G01R 31/40 |
| 2016/0071998 | A1 | 3/2016 | Nakano | |

FOREIGN PATENT DOCUMENTS

| | | |
|---|---|---|
| DE | 2737345 A1 | 3/1978 |
| DE | 102009049994 A1 | 5/2010 |
| DE | 102012210760 A1 | 1/2014 |
| DE | 102015213169 A1 | 1/2017 |
| EP | 2680682 A2 | 1/2014 |
| JP | 2003134795 A | 5/2003 |
| JP | 2015018861 A | 1/2015 |
| WO | 2014196285 A1 | 12/2014 |
| WO | 2015083250 A1 | 6/2015 |
| WO | 2015132835 A1 | 9/2015 |

\* cited by examiner

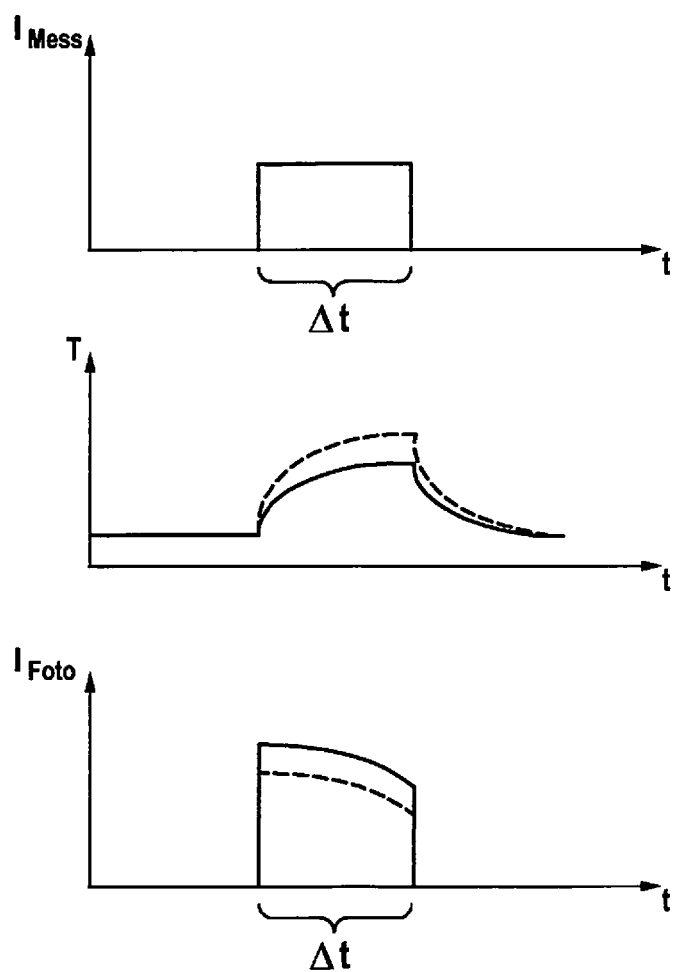

DEVICE FOR MEASURING A THERMAL DEGRADATION OF THE COOLING PATH OF POWER ELECTRONIC COMPONENTS USING LUMINESCENCE

FIELD OF THE INVENTION

The present invention relates to a device for converting electrical energy and to a method for determining a degradation of a cooling path using luminescence.

BACKGROUND INFORMATION

In many power electronic devices, switching-type semiconductor components are used for energy conversion. The components are thereby cooled by a cooling path. The applications of such devices include uses as power control units, as inverters or direct-current converters (DC/DC converters), for example, in electric vehicles, solar installations or wind power stations. Correct functioning of the component thereby requires a properly functioning cooling path. To be able to avoid or prevent component malfunction or failure, it is thereby beneficial or necessary in many applications to determine a degradation of the cooling path.

Exemplary semiconductor components used in such devices include metal oxide semiconductor field effect transistors (MOSFETs), insulated-gate bipolar transistors (IGBT), and diodes, which may be realized in silicon (Si), silicon carbide (SiC), or gallium nitride (GaN), for example.

The electronic semiconductor components deployed in the aforementioned devices are used for switching and include a free-wheeling path, which is configured in the non-conducting direction with respect to the switching element and generally corresponds to a diode.

Due to the functional requirements dictated by the configuration layout thereof, metal oxide semiconductor field effect transistors (MOSFETs) already include such a free-wheeling path, commonly known as a body diode.

Generally, switching-type semiconductor components which inherently have such a free-wheeling path, in particular insulated gate bipolar transistors (IGBT) are supplemented by a separate free-wheeling diode. To optimize the circuit, a separate free-wheeling diode, mostly in the form of a Schottky diode in this case, can likewise supplement a metal oxide semiconductor field effect transistor (MOSFET).

Photons to be emitted (luminescence) by operating p-n junctions in semiconductor components in the conducting direction and passing a current through the same. The intensity and wavelength of the light varies depending on the semiconductor used and the state of the p-n junction (doping concentration). The intensity of the emitted light is dependent on the current flow through the p-n junction and on the component temperature.

SUMMARY OF THE INVENTION

The present invention provides a device in accordance with the description herein for converting electrical energy, which includes at least one semiconductor component, a cooling path for cooling, and a device for determining a degradation of the cooling path on the basis of a current having a predetermined current intensity that flows through the component. The device is characterized by the semiconductor component including an optically active semiconductor structure, which generates light having a brightness that is dependent on a temperature of the device when the semiconductor component is traversed by current having the predetermined current intensity, and the device for determining the degradation also includes a brightness sensor for recording the brightness of the generated light.

The purpose of the method according to the present invention in accordance with the description herein is to determine a degradation of a cooling path of a semiconductor component, the electronic semiconductor component including an optically active semiconductor structure, which generates light having a brightness that is dependent on a temperature when the semiconductor component is traversed by a current having a predetermined current intensity. The method according to the present invention includes: recording the brightness of the generated light using a brightness sensor and determining the degradation of the cooling path on the basis of the flowing current using the recorded brightness.

The device according to the present invention has the advantage that the device for determining the current intensity and the component are inherently galvanically isolated. A signal evaluation at a low voltage level is even possible without electrical isolation. Furthermore, the device according to the present invention is characterized by a low construction volume and low production costs. In addition, the present invention allows a more fail-safe operation of the device for converting electrical energy, for example, by replacing the component in a timely manner in the case of a degradation that is increased above a limiting value.

In an especially specific embodiment of the device, a photodiode is provided as a brightness sensor, advantageously rendering possible the brightness measurement.

The device for determining a degradation may be configured for determining the degradation once a predetermined time period has elapsed during which the component is traversed by the flow of the current having the predetermined current intensity.

This makes it possible to apply a measurement current of a predetermined intensity for a time period that is long enough for the heat loss generated in the component to reach the cooling path, the result being a heating of the component and, thus, thermal influencing of the emitted light in dependence upon the functioning of the cooling path.

The device for determining a degradation may be configured for determining a charge by summing a photocurrent intensity of the photodiode over the predetermined time period. This makes it readily possible to minimize a degree-of-aging determination error caused by initial heat distribution effects in the component.

The device for determining a degradation may be configured for determining the degradation using the specific rated quantity (charge) and a reference rated quantity (reference charge).

In many applications, it is merely necessary to know a change relative to an initial value. In particular, a predetermined minimum deviation in the specific rated quantity (charge) from the reference rated quantity (reference charge) may initiate replacement of the component, for example.

Along with the advantage of an increased light efficiency, another specific embodiment provides that the switch having the free-wheeling path at least include a semiconductor component that is configured to be at least partially transparent. In this context, the function-related metallization (for example, drain or source electrode) may be partially open, and/or the encapsulation may have a transparent configuration, allowing the light to emerge from the semiconductor and/or the encapsulation thereof.

The inherently transparent edge of the semiconductor component (chip edge) may be used for this purpose, whereby further separate measures for achieving the transparency of the semiconductor component may be optionally omitted.

The relevant semiconductor components may be metal oxide semiconductor field effect transistors (MOSFETs) having a body diode and/or a separate anti-parallel free-wheeling diode or insulated-gate bipolar transistors (IGBT) having an anti-parallel free-wheeling diode.

To generate light, the body diode or the free-wheeling diode, or in the case of an IGBT, the p-n junction of the collector is used.

The semiconductor component may include an optically active zone for generating the light. This makes it possible to increase the light efficiency and improve the brightness determination.

This may also be alternatively or additionally achieved by the semiconductor component including a doping that increases the light generation.

The device may include a light guide element, which is configured to direct the generated light onto the light sensor.

The light efficiency may thereby likewise be increased and the brightness determination improved.

The device may be a power control unit or an inverter for an electric vehicle.

Advantageous embodiments of the present invention are set forth in the further descriptions herein and delineated in the description.

Exemplary embodiments of the present invention are clarified in greater detail on the basis of the drawing and the following description.

BRIEF DESCRIPTION OF THE DRAWINGS

FIG. 3 shows the correlation among a measurement current, a temperature of the component, and a photodiode current for an intact component and for a component having a degraded cooling path.

DETAILED DESCRIPTION

Figure 1:
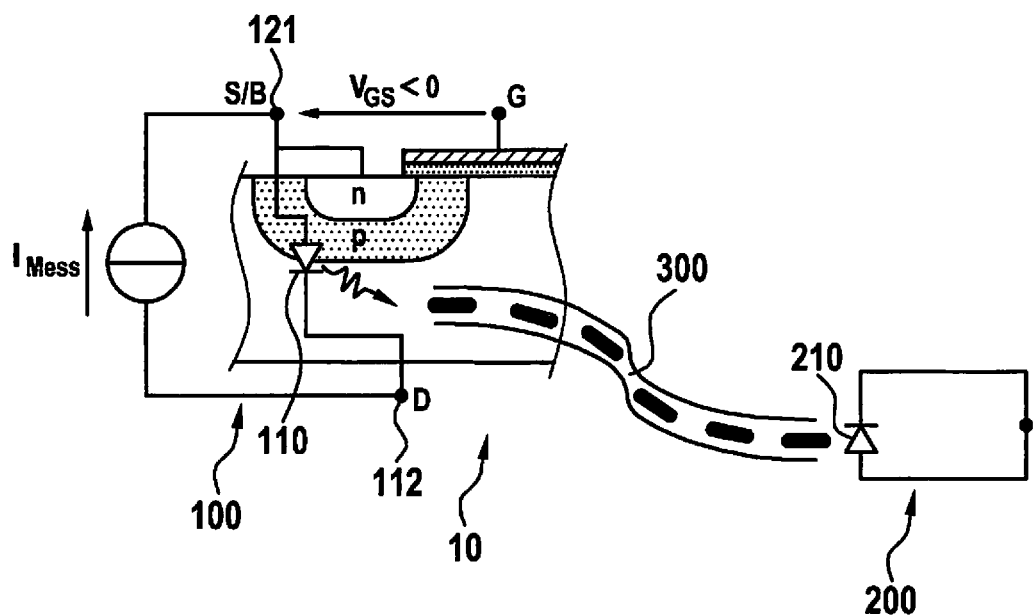
FIG. 1 schematically shows an exemplary specific embodiment of the present invention.

FIG. 1 schematically shows an exemplary specific embodiment of the present invention.

Figure 2:
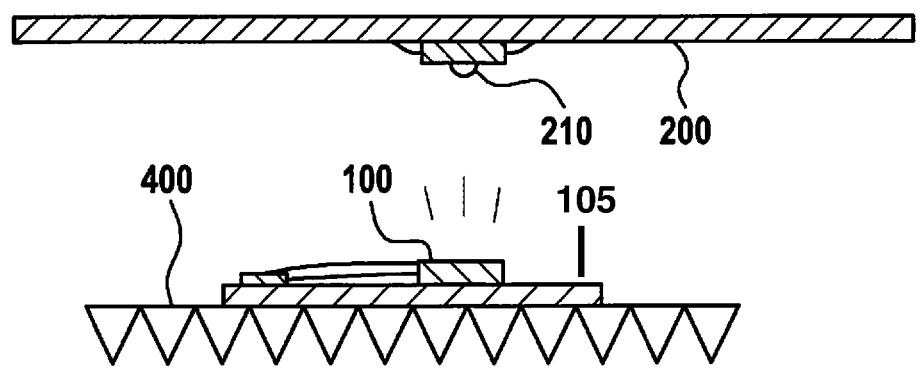
FIG. 2 shows another exemplary specific embodiment in a sectional view, with reference to exemplary measurement curves.

FIG. 1 shows a device 10 for converting electrical energy. This is effected by at least one switching-type semiconductor component 100. In the illustrated example, the switching-type semiconductor component is a metal oxide semiconductor field effect transistor (MOSFET), such as a Si MOSFET, a GaN MOSFET, or a SiC MOSFET, a diode or a body diode 110 of the MOSFET being used to generate light. However, other components may be alternatively used without departing from the present invention. As shown in FIG. 2, the component 100 is cooled by using a heat exchanger 400 that is connected to the component 100 via a cooling path provided by a pad or other thermal transfer element 105. In addition, device 10 includes a device 200 for determining a degradation of the cooling path of semiconductor component 100 on the basis of a current flowing through the component. A current intensity of the current may thereby be predetermined or follow a predetermined profile.

Semiconductor component 100 encompasses a highly doped substrate section not shown), is an optically active semiconductor and is connected between a source electrode 121 and a drain electrode 112 parallel to diode 110 via the separate source electrode-bulk connection 121. The optically active semiconductor makes up a part of a body diode of semiconductor component 100 and generates light having a brightness that is dependent on the current and temperature when semiconductor component 100 is traversed by current. Device 200 for determining the degree of aging of the cooling path includes a brightness sensor 210 for recording the brightness of the generated light. In the illustrated example, brightness sensor 210 is a photodiode; however, other brightness sensors may be alternatively or additionally used without departing from the present invention. In some exemplary specific embodiments, the relationship between brightness and temperature is reciprocal; the brightness decreases in response to a rising temperature.

Semiconductor component 100 includes an at least partially transparent electrode and/or an at least partially transparent encapsulation, through which the generated light may emerge from electronic component 100.

In another exemplary specific embodiment, the component includes a partially transparent drain metallization on the bottom side. It is also possible to open the gate metallization on the top side next to the source metallization. The third option provides for using the transparent chip edge. This eliminates the need for special metallizations and/or openings.

Device 10 includes a light guide element 300, which is configured to direct the generated light onto photodiode 210. In terms of the potentials thereof, component 100 and brightness sensor 210 are separated by the optical transmission link therebetween. This is especially beneficial for high voltage applications. Brightness sensor 210 may also be integrated together with component 100.

In another exemplary specific embodiment, the need for a light guide element is eliminated, and scattered light is directly evaluated.

The brightness of the generated light at a predefined measurement current intensity may then be recorded by the brightness sensor, and the degree of aging of the cooling path determined using the recorded brightness. In this case, the temperature dependence of the luminescence is used as a function of the known current.

In the illustrated example, a rated quantity/charge may be determined by summing a current intensity of the current flowing through the photodiode over a predefined time period.

With reference to exemplary measurement curves, FIG. 3 shows the correlation among a measurement current, a temperature of the component, and a photodiode current for an intact component and for a component having a degraded cooling path.

A measurement current $I_{sense}$ having a predetermined current intensity is applied for a time period $\Delta t$. This is shown in the upper curve. Temperature T in the component thereby rises in time period $\Delta t$. Upon interruption of the measurement current, the temperature drops again. Because of the degraded cooling path, the temperature of the component (dashed line curve) having the degraded cooling path rises more sharply than that of the intact component (solid-line curve). The middle curves show this. Accordingly, the different temperature profiles result in different photocurrents $I_{photo}$. Summing the difference of photocurrents $I_{photo}$ over time period $\Delta t$ yields the area between the curves, which corresponds to a rated quantity/charge.

In the example, the measurement current $I_{sense}$ having a predetermined current intensity is constant. Possible, however, is a measurement current $I_{sense}$ that varies in the current intensity thereof within a predefined time period in a predetermined manner.

The current flowing through the photodiode may be amplified, converted into a digital signal and conditioned prior to the evaluation. The conditioning may include smoothing, filtering, and/or time synchronization, for example.

An exemplary specific embodiment of the method requires repeating the measurement at regular intervals under the same conditions, specifically at the same initial temperature. The repetition may be carried out, for example, in response to exceedance of a predefined cooling medium temperature. The system then includes an internal memory for reconciling the rated quantities.

In an exemplary specific embodiment of the method, in response to exceedance of a predetermined cooling medium temperature, for example, the semiconductor is heated by a predetermined current until a predetermined quantity of light has been emitted. The time period required for this is measured. The shorter this time period is, all the worse is the connection of the semiconductor via the cooling path.

Therefore, in other exemplary specific embodiments, the device includes an amplifier and/or an analog-to-digital converter and/or a signal-preprocessing element.

In a sectional view, FIG. 2 shows another exemplary specific embodiment.

Switching-type semiconductor component 100 is configured here on a heat exchanger 400 to dissipate heat generated during switching operations in component 100. Configured opposite one side of component 100, upon which heat exchanger 400 is disposed, is a transparent encapsulation of component 100 next to the optically active region. The transparent encapsulation thereby forms the opposite side. Light, which is produced in the highly doped substrate section, may emerge through the transparent encapsulation from component 100 in the direction of photodiode 210. In the example, photodiode 210 is configured on a printed circuit board 200 (PCB).

In an exemplary specific embodiment of a method of the present invention, a predefined, constant measurement current $I_{sense}$ unequal to zero is impressed upon a pn junction of a semiconductor (for example, body diode of a field effect transistor) for a predetermined, fixed time period Δt. The semiconductor is heated by measurement current $I_{sense}$ and excited to luminescence. Upon expiration of time period Δt, the resulting heat flow reaches a cooling path of the semiconductor (thermal coupling).

Over the time period, a light-sensitive sensor, in the exemplary embodiment, a photodiode records the intensity of the luminescence as a resulting photocurrent.

In the exemplary embodiment, the photocurrent of a photodiode is summed during time Δt; the evaluation resulting in a rated quantity, for example, a charge quantity. If the thermal coupling ages, inducing a rise in thermal impedance, the heat is not able to be dissipated quite as effectively during the heating, so that temperature T of the semiconductor in a barrier layer rises more sharply. The higher temperature reduces the luminescence, so that a significant dependency arises between the specific rated quantity, for example, the specific charge quantity, and the temperature, and thus the degradation of the cooling path.

In the exemplary embodiment, the specific rated quantity, for example, the specific charge quantity, is subtracted from and/or set into relation with a reference rated quantity, for example, a predetermined desired charge quantity that would flow if the semiconductor were intact. This yields a relative deviation from the reference rated quantity, for example, the desired charge, and is used as a measure of degradation in the exemplary embodiment.

If the amount of relative deviation exceeds a predefined threshold, for example, 0.1 (corresponding to at least 10% drift in comparison to normal), then an exemplary embodiment of the method provides that the semiconductor be replaced regardless of the basic functioning thereof.

The degradation of the cooling path is a relatively slow process over the service life, so that there is no need to record the state during operation.

Therefore, in this or other embodiments of the method, the method is carried out as a background process in the course of a process of switching on the semiconductor (initialization of a system that includes the semiconductor, for example, upon opening a vehicle or starting an engine of the vehicle that includes the semiconductor) and/or in the course of a process of switching off the semiconductor (shutting down the system, for example upon switching off the engine or the vehicle).

What is claimed is:

1. A device for converting electrical energy, comprising:
   at least one switching-type semiconductor component;
   a cooling path directly in contact with said semiconductor component for cooling the semiconductor component for cooling the semiconductor component; and
   a device for determining a degradation of the cooling path based on a current having a predetermined current intensity that flows through the component;
   wherein the semiconductor component is an optically active semiconductor, which generates light having a brightness that is dependent on a temperature when the semiconductor component is traversed by current having a predetermined current intensity, and wherein the device for determining the degradation includes a brightness sensor for recording the brightness of the generated light.

2. The device of claim 1, wherein the brightness sensor includes a photodiode.

3. The device of claim 2, wherein the device for determining a degradation is configured to determine a charge quantity by summing a photocurrent intensity of the photodiode over the predetermined time period.

4. The device of claim 3, wherein the device for determining a degradation is configured to determine the degradation using the charge quantity.

5. The device of claim 1, wherein the device for determining a degradation is configured to determine the degradation once a predetermined time period has elapsed during which the component is traversed by the current having the predetermined current intensity.

6. The device of claim 1, wherein the semiconductor component includes at least a metal oxide semiconductor field effect transistor (MOSFET) having an at least partially transparent source electrode, through which the generated light can emerge from the MOSFET, the MOSFET being a GaN-based MOSFET or a SiC-based MOSFET, and wherein a diode or a body diode of the MOSFET is used to generate light, and the device includes a substrate section which is connected between the source electrode and a drain electrode parallel to the diode.

7. The device of claim 1, wherein the semiconductor component includes the optically active semiconductor for generating the light and/or a doping that increases the generation of light.

8. The device of claim 1, wherein the device includes a light guide element to direct the generated light onto the brightness sensor.

9. A method of determining a degradation of a cooling path directly in contact with a semiconductor component, the method comprising:
   generating, using a current having a predetermined current intensity that flows through the semiconductor component, the semiconductor component being an optically active semiconductor, light having a brightness that is dependent on a temperature when the semiconductor component is traversed by current having the predetermined current intensity;
   recording a brightness of the generated light using a brightness sensor; and
   determining the degradation using the recorded brightness.

\* \* \* \* \*